United States Patent [19]
Babbs

[11] Patent Number: 5,984,116
[45] Date of Patent: *Nov. 16, 1999

[54] SUBSTRATE SUPPORT APPARATUS FOR A SUBSTRATE HOUSING

[75] Inventor: Daniel A. Babbs, Tavis County, Tex.

[73] Assignee: Progressive Systems Technologies, Inc., Austin, Tex.

[*] Notice: This patent is subject to a terminal disclaimer.

[21] Appl. No.: 08/965,990

[22] Filed: Nov. 7, 1997

Related U.S. Application Data

[63] Continuation of application No. 08/599,537, Feb. 6, 1996, Pat. No. 5,823,361.

[51] Int. Cl.$^6$ .................................................. A47F 7/00
[52] U.S. Cl. ............................................................. 211/41.1
[58] Field of Search ............................... 211/41.1, 41.17, 211/41.18, 41.4, 41.12, 41.13, 40

[56] References Cited

U.S. PATENT DOCUMENTS

| | | |
|---|---|---|
| 1,246,940 | 11/1917 | Safford ................................... 211/41.1 |
| 1,900,053 | 3/1933 | Glidden ................................... 211/41.1 |
| 4,572,101 | 2/1986 | Lee . | 
| 5,219,079 | 6/1993 | Nakamura . |
| 5,429,251 | 7/1995 | Matthews . |
| 5,503,173 | 4/1996 | Kudo et al. . |
| 5,534,074 | 7/1996 | Koons . |

*Primary Examiner*—Alvin Chin-Shue
*Assistant Examiner*—Sprah Purol
*Attorney, Agent, or Firm*—Akin, Gump, Strauss, Hauer & Feld, LLP

[57] ABSTRACT

A substrate support apparatus for supporting one or more substrates in a substrate carrier for achieving a minimum amount of sagging of the substrates. A first support rod is positioned to support one side of each substrate along a first support contact line and a second support rod is positioned to support the other side of the substrate along a second support contact line. The first and second support contact lines are referenced to a centerline of the substrate. In particular, both contact lines are offset by a certain distance on either side of the centerline, where the particular offset of the support lines is determined by finite element analysis of the substrate to achieve as little sag as possible. The rod support member preferably includes two cantilevered beams mounted on either side of each of the support rods. Also, a plurality of support rods and corresponding rod support members are provided for supporting as many substrates as necessary in the carrier. In one embodiment, a single support rod is provided for each contact support line, where the rod may extend the entire length of the substrate. In another embodiment, two support rods are provided for each contact support line, the total length of each pair of rods being less than the length of the substrate.

12 Claims, 6 Drawing Sheets

SUBSTRATE SUPPORT APPARATUS FOR A SUBSTRATE HOUSING

CROSS REFERENCE TO RELATED APPLICATIONS

The present application is a continuation of U.S. application Ser. No. 08/599,537, filed Feb. 6, 1996 by Daniel A. Babbs (Attorney Docket No. A96001US) now U.S. Pat. No. 5,823,361.

FIELD OF THE INVENTION

The present invention relates to substrate cassettes or carriers for carrying and supporting substrates, and more particularly to a substrate support apparatus for supporting substrates within a substrate carrier.

DESCRIPTION OF THE RELATED ART

Glass or semiconductor substrates, such as wafers, masks, flat panel displays (FPDs), etc. are typically transported between, and processed by, one or more automatic processing stations in a substantially clean environment. FPDs are generally flat, rectangular plates made of amorphous glass with various sizes, including relatively large FPDs measuring 550 millimeters (mm) by 650 mm by 1.1 mm thick. The FPD industry trend, however, is towards larger substrates measuring 700 mm by 1000 mm, 850 mm by 1050 mm, and larger. Further, the trend is towards thinner substrates having thicknesses of 0.7 mm. The present invention generally concerns the handling of any type of substrate and is not limited to the substrates listed or described herein.

One or more such substrates are often inserted into a box-like plastic cassette, which includes a plurality of coplanar slots for maintaining and supporting the substrates in a spaced relationship relative to each other. Each cassette is implemented for the particular type of substrate, and usually includes an open face for allowing insertion, removal and access of substrates inserted therein, typically by automatic processing systems. The cassette provides support for and access of the substrates during processing, where a processing system is more easily able to retrieve or deposit the substrates. Such cassettes also enable more convenient transportation of the substrates from one processing station to another within the working environment. Often, an operator carries one or more such cassettes on a cart or the like between processing stations, and then unloads cassettes from the station and/or loads new cassettes onto the station.

One overwhelming challenge with substrates, particularly large glass substrates, is gravitational sag of the substrate due to its own weight within the carrier. Typical cassettes supported the substrates at their extreme side edges, where the front and rear edges of the substrate were unsupported. These unsupported edges, particularly at or near the center of these edges, were susceptible to significant sagging caused by gravity. However, the front or the rear edge is where automatic processing equipment, such as robotic pick and place units, access the substrate for removal and processing. Furthermore, such equipment accesses the substrate near the center of the unsupported edge where the sag is greatest. These problems are made worse with larger, yet thinner substrates. Larger FPDs are heavier. Decreasing the substrate thickness reduces the weight and also improves the electrical characteristics of the substrate. For example, the trend is towards 0.7 mm thick FPDs as compared to 1.1 mm. The increased size and reduced thickness, however, resulted in a reduction of the inherent mechanical strength of the substrate, which further resulted in greater sag when supported within a traditional cassette. For example, a substrate with an unsupported edge of 600 mm sags by as much as 8 to 12 mm at the center of the edge.

Such sagging compromised the substrate by inducing residual stresses within the glass as well as within the thin layers and/or films of various metals and process materials that form the miniature circuits mounted along the surface and on any inner layers of the substrate. Such stress increased the likelihood of damage to the thin layers, which are typically in a range of one micron. Significant damage often caused the substrate to fail. Further, increased likelihood of damage decreased overall production yields of the substrates.

Significant sagging greatly complicated the automation process. For example, a robotic system had to displace the substrate a greater distance to lift the substrate from its sagging position. Such increased displacement added to the automation cost since robots having increased travel capability were required. Furthermore, sagging caused alignment problems of the substrates. The edges of a sagging substrate are not perpendicular to the bottom and top surfaces of the substrate, which results in a poorly defined plane. Thus the sagging substrate appeared to have a reduced width due to arcing of the substrate. This characteristic made it difficult to locate the edges of the substrate for purposes of alignment.

One possible solution is to support the entire lower surface of the substrate. This solution is undesirable, however, because the size of the substrates require that they be handled by automatic processing equipment that requires access to the lower surface of the substrate.

It is desired to provide a housing or cassette for supporting a plurality of substrates without significant sagging.

SUMMARY OF THE INVENTION

A substrate support apparatus according to the present invention supports one or more substrates in a substrate carrier with a minimum amount of sagging of the substrates. The substrate support apparatus includes a first support rod positioned to support one side of each substrate along a first support contact line and a second support rod positioned to support the other side of the substrate along a second support contact line. The first and second support contact lines are referenced to a centerline of the substrate. In particular, both contact lines are offset by a certain distance on either side of the centerline, where the particular offset of the support lines is determined by finite element analysis of the substrate to achieve as little sag as possible. At least one rod support member is mounted to each of the support rods and to the substrate carrier.

Preferably, the rod support member comprises two cantilevered beams mounted on either side of each of the support rods. Also, a plurality of support rods and corresponding rod support members are provided for supporting as many substrates as necessary in the carrier. To obtain the desired rigidity while also keeping the carrier relatively lightweight, the rod support members are made of a lightweight, yet relatively sturdy material, such as aluminum. The substrates may be any type of substrates, such as wafers, masks, flat panel displays (FPDs), printed circuit boards (PCBs), etc., and may be made of any type of substrate material, such as amorphous glass, semiconductor material, FR-4 or 1060 material or other fiberglass material, etc. The present invention is particularly advantageous for supporting glass FPDs. To protect the substrates, the support rods are preferably made of any material having sufficient chemical, abrasion and mechanical properties. For example, a thermoplastic, such as polyetheretherketone (PEEK) or the like may be used.

In one embodiment, the support rods extend along the entire length of each substrate. However, it has been discovered that minimal sagging of the substrates may be achieved even if the support rods extend less than the entire length of the substrate. Thus, the support rods may have a length of more than 35% the total length of the substrate. Or, the support rods may also have a length of less than 50% the total length of the substrate. Finite element analysis may be used to determine an optimal offset from the centerline for the contact support lines for achieving a minimal amount of sagging of the substrate. It has been determined, however, that acceptable results may be achieved within a range of offsets.

In another embodiment, more than one support rod is provided for supporting the substrate along each contact support line. For example, two support rods are provided along both support lines, where one rod is positioned towards the front and the other towards the back of the substrate. In this manner, four separate support rods are provided for each substrate. The front and back rods are preferably co-linear and have a total length of between 35% to 50% the length of the substrate.

In a more particular embodiment, a substrate carrier is provided for supporting a plurality of substrates, such as up to 20 substrates. The substrates are preferably glass 550 mm by 650 mm FPDs, typically having a thickness of 0.7 mm. A centerline is defined parallel to the 650 mm edges of the substrates, where the contact lines of support are offset from the centerline by approximately 155 to 160 mm. Acceptable results are achieved, however, in the range of 145 to 170 mm. Two 150 mm support rods are provided for each support line for a total of four rods per substrate, where each pair of rods support less than 50% of the length of the substrate. The substrates exhibit less than 1 mm of sag across their entire surface. Preferably, the support rods are mounted to rod supports integrally formed on two substrate support racks, one support rack located towards the front and the other towards the back of the carrier. Each support rack includes two side racks mounted parallel to each other, where each side rack includes two opposite support posts for integrally mounting the rod supports. In this manner, two rod supports are provided on both ends for mounting of each of the support rods. Each of the side racks includes a top beam and a bottom beam integrally mounted to respective support posts on either side of the carrier. The support racks including the side racks and rod supports are preferably made of aluminum for rigidity and to achieve a relatively lightweight design.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENTS

Figure 1:
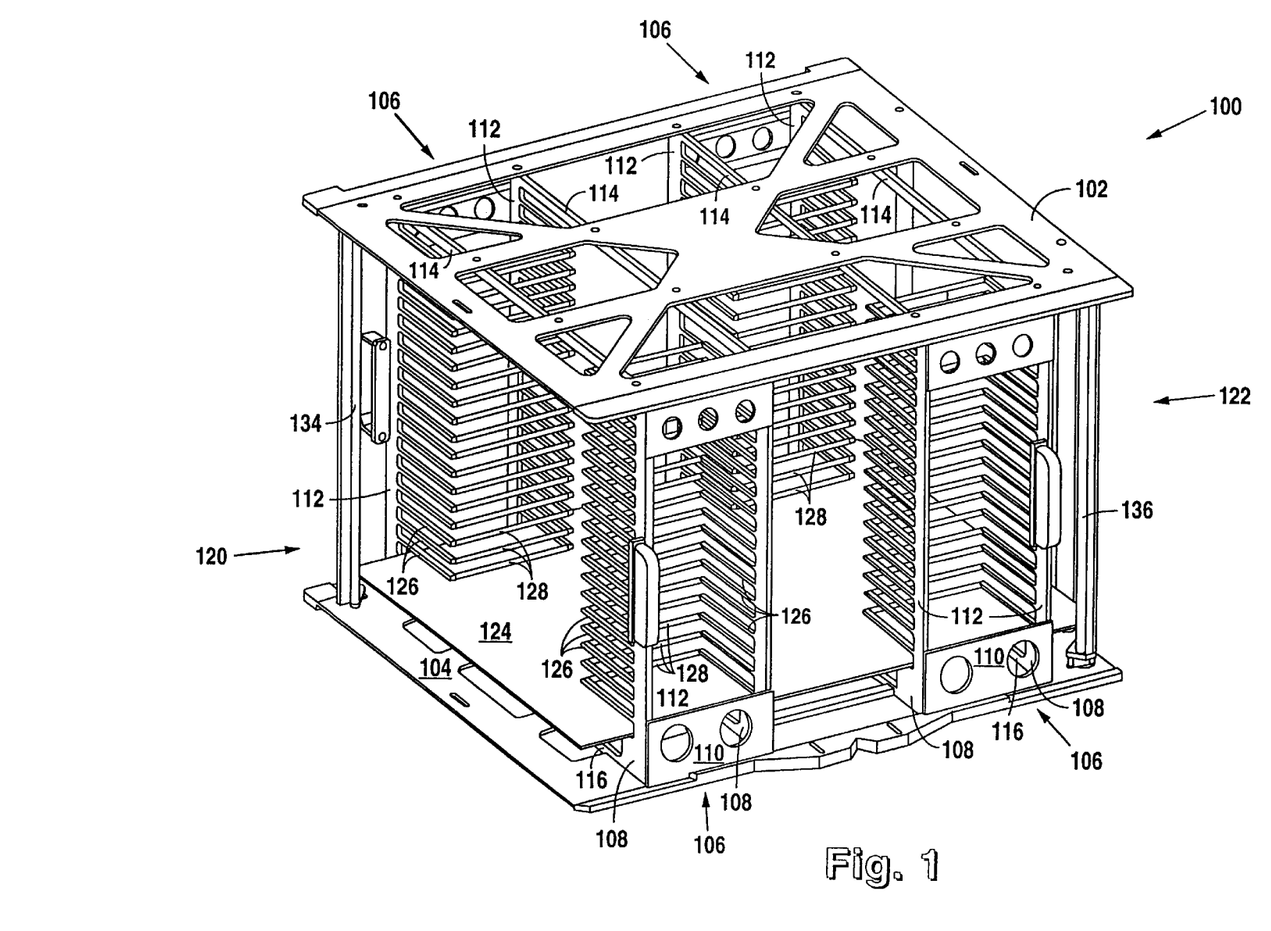
FIG. 1 is a perspective view of a substrate carrier including a plurality of substrate supports implemented according to the present invention.

Referring now to FIG. 1, a perspective view is shown of a substrate cassette or carrier 100 including a plurality of substrate supports 132 according to the present invention. The substrate carrier 100 is preferably a box-like, open-air unit for receiving, supporting and aligning a plurality of rectangular substrates in a spaced relationship relative to one another for transporting the substrates between processing stations and for presenting substrates in alignment to a processing station. It is noted, however, that the present invention is also applicable to enclosed carriers which maintain a clean environment during transport of the substrates. The substrate carrier 100 is of any convenient size, depending upon the type and size of the substrates being handled. A processing station (not shown) preferably includes robotic pick and place units for inserting and/or extracting the substrates into the substrate carrier 100.

The substrates are preferably flat panel displays (FPDs), semiconductor wafers, masks, microchip modules (MCM), etc. In the preferred embodiment, the substrates are preferably relatively thin glass substrates typically used for processing FPDs or the like. It is noted, however, that the present invention is not limited to glass substrates, but is applicable to any type of substrate, such as substrates formed of aluminum, Mylar®, semiconductor materials, etc. Furthermore, the present invention may be applied to printed wiring boards (PCBs) such as sheets of FR-4 or 1060 material or other fiberglass material, etc. The substrates are preferably relatively large substrates having a size of 650 millimeters (mm) by 550 mm, 700 mm by 1000 mm, 850 mm by 1050 mm, etc. Also, the substrates may have any desired thickness, such as 1.1 mm, 0.7 mm, etc. The present invention is not limited, however, to any particular type, size or thickness of the substrates.

The industry trend is towards larger and thinner glass substrates for FPDs. Up until now, substrate carriers supported the substrates along the substrate edges, resulting in a significant amount of sagging of the substrate when loaded into the carrier. This sagging problem increases as the length and width of the substrates increases while the thickness decreases, where the substrates are more "paper-like". An exemplary glass substrate 124 is shown loaded into the substrate carrier 100, where the substrate 124 is a 650 millimeters (mm) by 550 mm by 0.7 thick.

The substrate carrier 100 includes a substantially rectangular top plate 102 and another substantially rectangular bottom plate 104 mounted on the top and bottom, respectively, of two substrate support racks 106. Each support rack 106 includes two flat side racks 108 mounted parallel to each other with a plurality of brace plates 110. Each side rack 108 includes two support posts 112 integrally mounted to a top beam 114 and a bottom beam 116 (FIG. 2) forming a relatively flat rectangular frame. In this manner, each support rack 106 includes two rectangular side racks 108 with two top beams 114 and two bottom beams 116, where the side racks 108 are substantially mounted together in parallel using the brace plates 110. The top plate 102 is mounted to the four top beams 114 and the bottom plate 104 is mounted to the four bottom beams 116 using a plurality of screws or any other suitable type of fastening means, so that the support racks 106 are substantially aligned with each other. As shown in FIG. 1, the substrate carrier 100 forms an open, box-like structure having an open front end 120 and an open back end 122 for receiving and supporting one or more rectangular substrates, such as the substrate 124. Only one substrate 124 is shown for purposes of clarity, it being understood that one or more substrates may be inserted into the substrate carrier 100.

In the preferred embodiment, a plurality of support arms 126 are integrally mounted to each support post 112 of each of the support racks 106, thereby forming a stack of support arms 126 aligned in an orthogonal plane extending from the bottom to top of the substrate carrier 100 for each support post 112. Each support arm 126 is generally a beam-like arm horizontally extending from the corresponding support post 112 into the interior of the substrate carrier 100. Each support arm 126 is preferably aligned with one other support arm 126 on the opposite support post 112 of the same side rack 108 along a horizontal plane referenced parallel to the top and bottom plates 102, 104.

A plurality of support rods 128 are provided, where each support rod 128 is mounted between every two aligned support arms 126 between opposite support posts 112. Also, each support arm 126 is preferably horizontally aligned with one other support arm 126 of the adjacent side rack 108 of the same support rack 106, where the other support arm 126 is itself horizontally aligned with one other support arm 126 on the opposite support post 112, where these opposite support arms 126 also have a support rod 128 mounted therebetween. Furthermore, both of the support racks 106 are aligned with each other, so that a group eight support arms 126 and four corresponding support rods 128 are aligned in one horizontal plane, another eight support arms 126 and four corresponding support rods 128 are aligned in a second parallel horizontal plane, etc., forming a plurality of parallel slots 130 (FIG. 2) within the substrate carrier 100. Each group of eight support arms 126 and four corresponding support rods 128 of each slot 130 is referred to as a substrate support 132. Thus, four substrate supports 132 are provided for each slot 130, and thus for each substrate 124.

After one or more substrates 124 are loaded into the substrate carrier 100, a substrate aligner, including a front engagement assembly 134 and a back engagement assembly 136, is provided for engaging and constraining the substrates 124 into an aligned position. This substrate aligner is described in a related application, Ser. No. 08/563,134 entitled "Aligner for a Substrate Carrier," filed Nov. 27, 1995, now U.S. Pat. No. 5,853,214 having a common inventor and having a common assignee as the present disclosure, which related application is hereby incorporated by reference.

Figure 2:
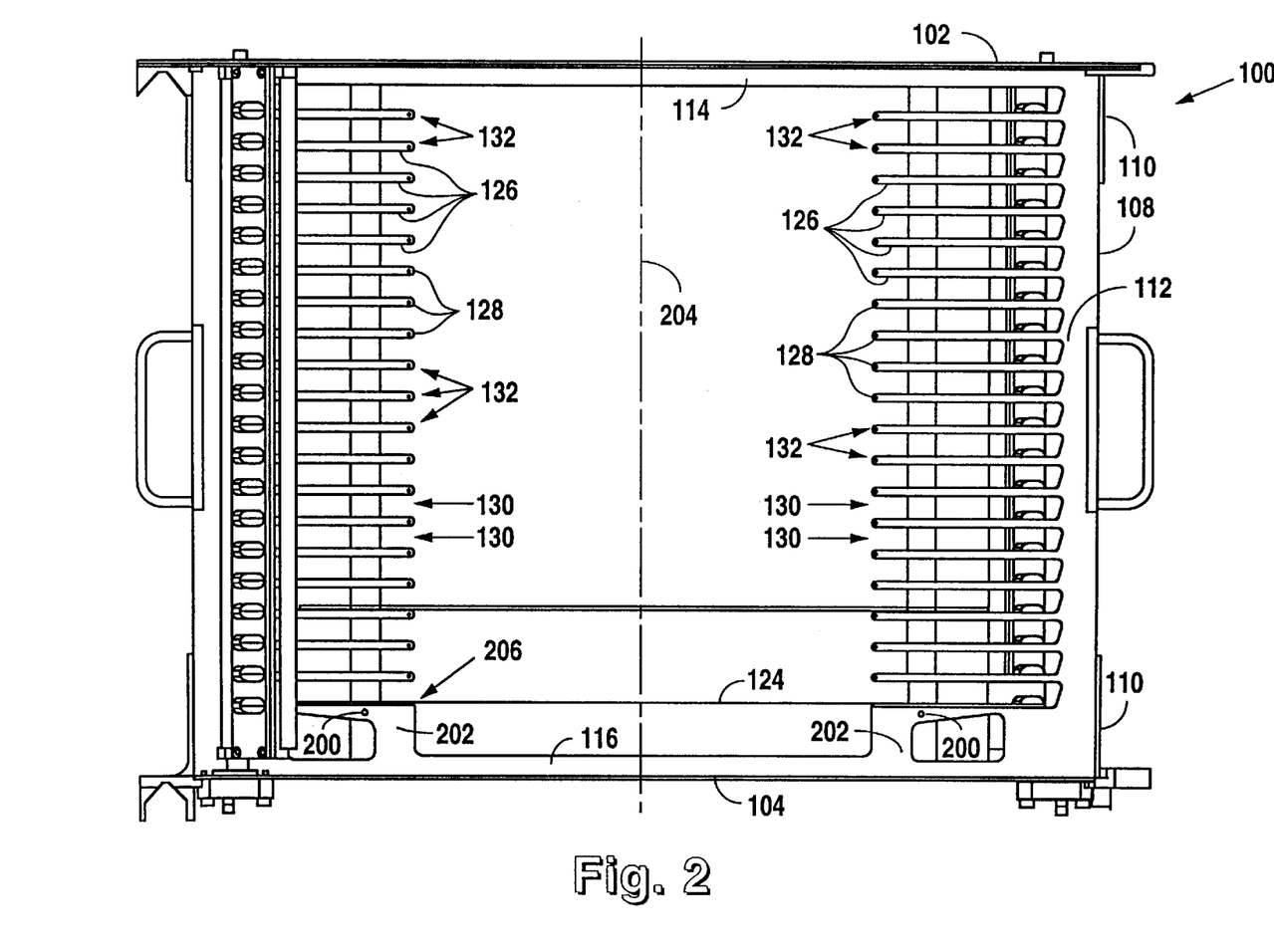
FIG. 2 is a front view of the substrate carrier of FIG. 1.

FIG. 2 is a front view of the substrate carrier 100 of FIG. 1. FIG. 2 more clearly shows each of the parallel slots 130 formed by the substrate supports 132. In the embodiment shown, twenty (20) such slots are included for supporting up to twenty substrates 124, although the present invention contemplates any number of slots 130. Also, FIG. 2 illustrates more clearly the preferred embodiment, where the rectangular side racks 108 are formed from two side support posts 112, a top beam 114 and a bottom beam 116. The lowermost slot includes thicker support arms 200, and further includes support beams 202 mounted between the arms 200 and the bottom beam 116 for providing additional mechanical support for the side racks 108. Each of the support arms 126 are cantilevered, preferably being integrally mounted to its corresponding support post 112 and extending into the interior of the substrate carrier 100 of a corresponding slot 130. Thus, each of the support arms 126, 200 extend inwards enough to support the substrates 124 closer to their centers, illustrated at locations 206. This is in contrast to prior art support means, which only supported substrates at or near their side edges, thereby allowing the substrates to sag towards their center, as referenced by a centerline 204. This is particularly true for larger and thinner substrates. Supporting the substrates 124 closer towards their centers significantly reduce such sag. In the preferred embodiment, the locations 206 are offset from the centerline 204 by approximately 155–160 mm for substrates 124 having a width of 550 mm. Preferably, each of the substrate support racks 106 and corresponding plurality of support arms 126 are made of aluminum for providing excellent rigidity while also being lightweight. However, any material providing sufficient rigidity to support the substrates 124 is contemplated.

Although aluminum provides sufficient rigidity of the support arms 126, 200 for supporting the substrates 124, aluminum is not ideal for contacting the substrate since there is an increased risk of scratching the surface of the substrates. To reduce the risk of scratching the surfaces of the substrates 124, the support rods 128 are provided for interfacing and supporting the substrates 124. In particular, the support rods 128 are mounted at the ends of the support arms 126, 200 for interfacing the substrates 124. Preferably, each support rod 128 is made of a plastic material with sufficient chemical, abrasion and mechanical properties for interfacing the substrates 124. In the preferred embodiment, the substrates 124 are glass, so that the rods support preferably comprise a thermoplastic, such as polyetheretherketone (PEEK) or the like. Of course, any material having sufficient chemical, abrasion and mechanical properties may be used.

Figure 3:
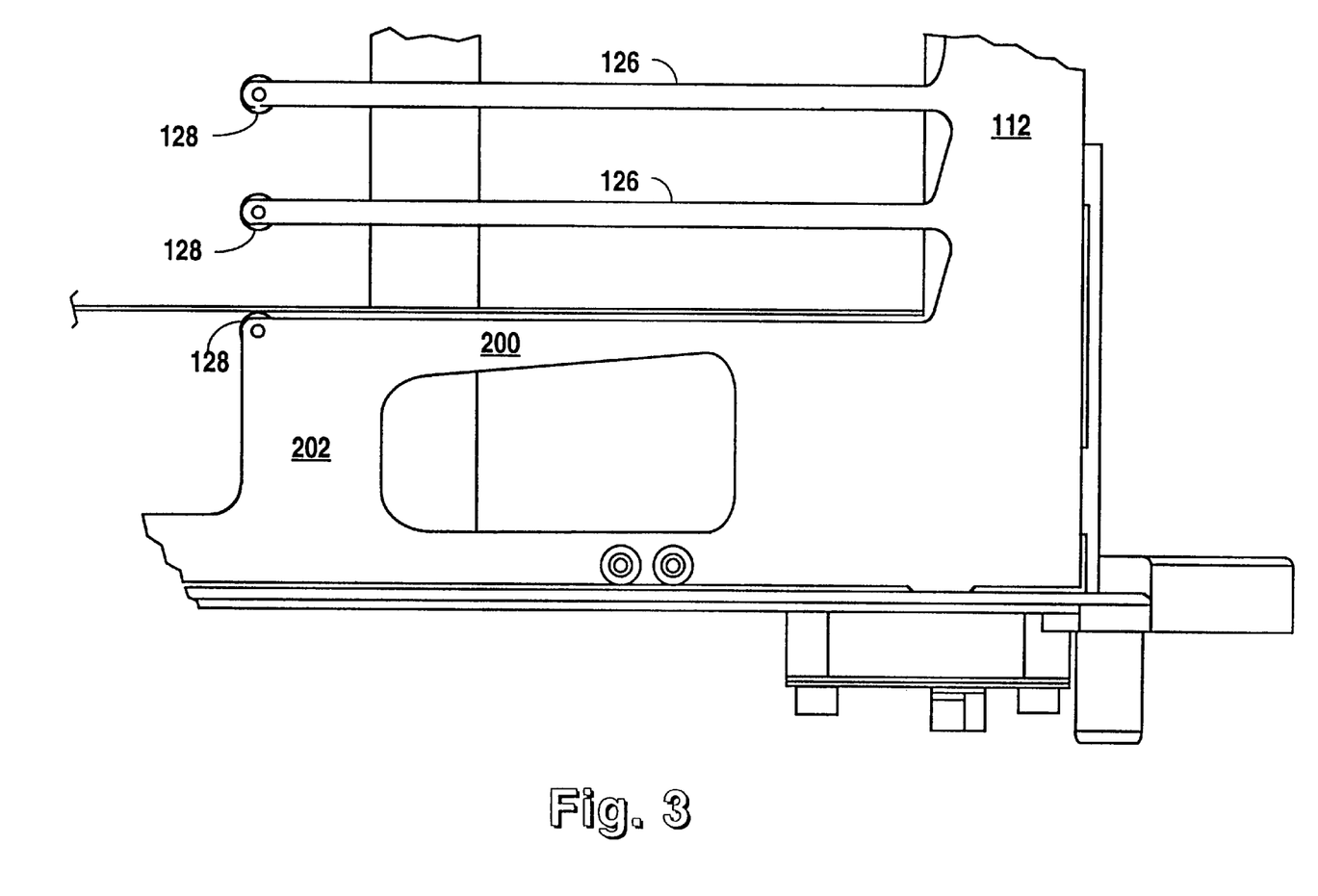
FIG. 3 is a more detailed view of the substrate supports shown in FIG. 2.

FIG. 3 is a more detailed view of the support arms 126, 200 and the support rods 128 of the substrate supports 132 shown in FIG. 2. Generally, the support rods 128 are thicker than the support arms 126 and are mounted to extend above and below support arms 126 to protect the substrates 124. In the preferred embodiment, the support arms 126 preferably have a thickness of approximately 4 mm, whereas the support rods 128 are round having a circumference of over 6 mm, preferably approximately 6.35 mm. For the lowermost support arm 200, a support rod 128 is mounted to extend above the arm 200 to prevent contact with the substrate 124.

Figure 4:
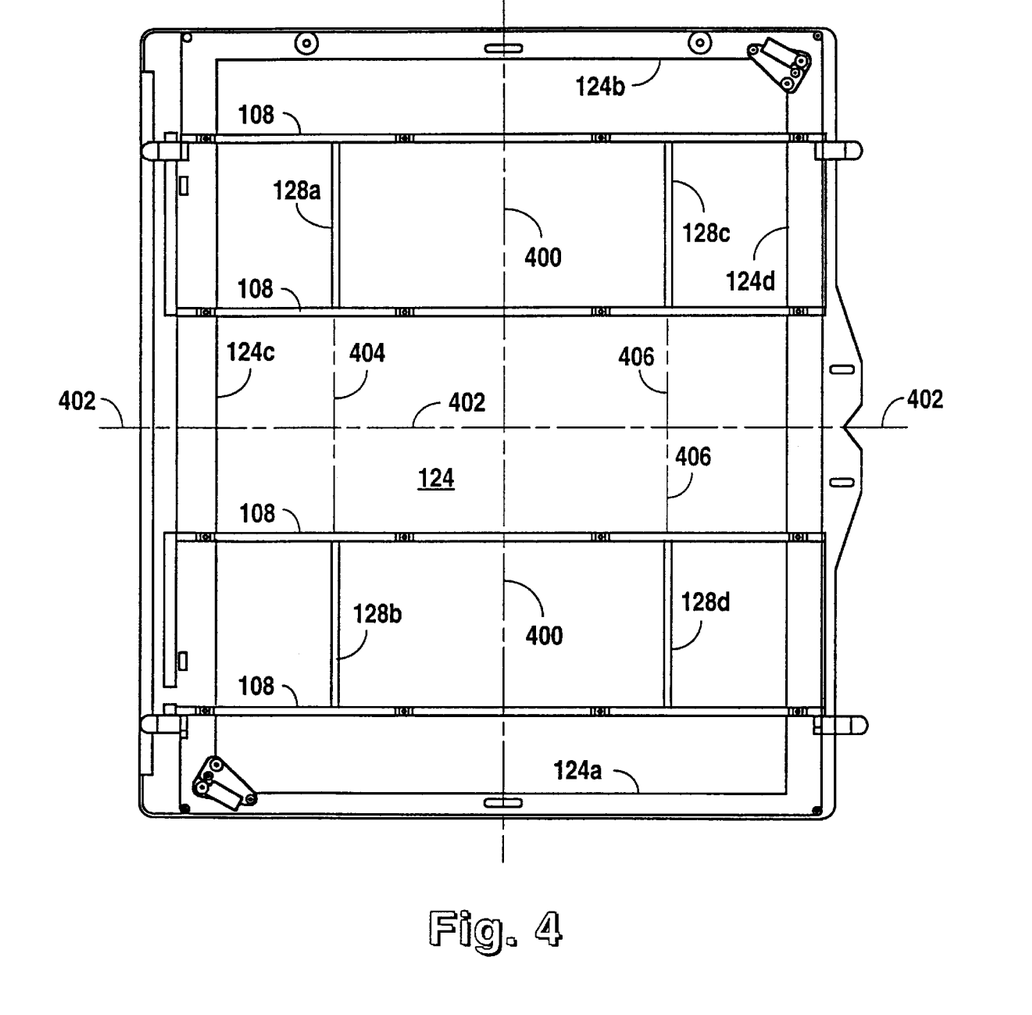
FIG. 4 is a top view of the substrate carrier of FIG. 1.

FIG. 4 is a top view of the substrate carrier 100 of FIG. 1 with the top plate 102 removed. As shown, the substrate 124 has a width of approximately 550 mm extending between the sides of the substrate carrier 100. The substrate 124 has two side edges 124c and 124d which are approximately centered relative to a centerline 400 extending from the front to the back of the substrate carrier 100. The substrate 124 also a front edge 124a and a back edge 124b and has a length of approximately 650 extending between the front and the back of the substrate carrier 100. The front and back edges 124a, 124b of the substrate 124 are preferably aligned and centered relative to another centerline 402 extending from one side to the other of the substrate carrier 100.

Preferably, the substrate support racks 106 are aligned parallel to, but offset from, the centerline 402, where the closest side rack 108 of each of the support racks 106 to the centerline 402 is mounted at an offset of approximately 100 mm from the centerline 402. The two side racks 108 of both of the substrate support racks 106 are mounted approximately 150 mm apart from each other, so that the farthest side rack 108 for each substrate support rack 106 is offset approximately 250 mm from the centerline 402. Also, each of the support rods 128 are approximately 150 mm long. Each of the support rods 128 are aligned parallel with the centerline 400 at an offset of approximately 150 mm. Four support rods 128 are provided to support each substrate 124. Thus, each of the support rods 128 are aligned parallel with the side edges 124c and 124d, where two of the support rods 128 are co-linear and offset at approximately 115–120 mm from the side 124c, and the other two support rods 128 are co-linear and offset at approximately 115–120 mm from the other side 124d, for each substrate 124. As shown in FIG. 4, two support rods 128a and 128b of each group of four are co-linearly aligned along a line 404, which is offset from the centerline 402 of the substrate 124 by approximately 155–160 mm. Also, the other two support rods 128c and 128d are co-linearly aligned along a line 406, which is offset from the centerline 402 of the substrate 124 by approximately 155–160 mm.

Figure 5:
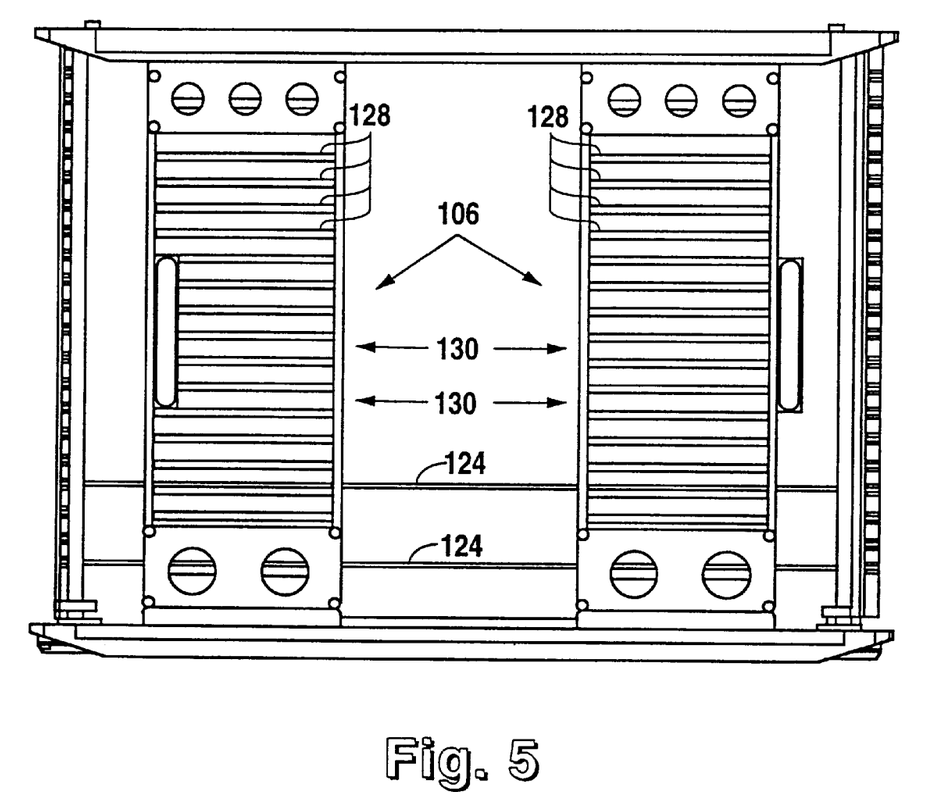
FIG. 5 is a side view of the substrate carrier of FIG. 1.

FIG. 5 is a side view of the substrate carrier 100, showing each of the substrate support racks 106 and the corresponding aligned support rods 128 for each of the slots 130.

Figure 6:
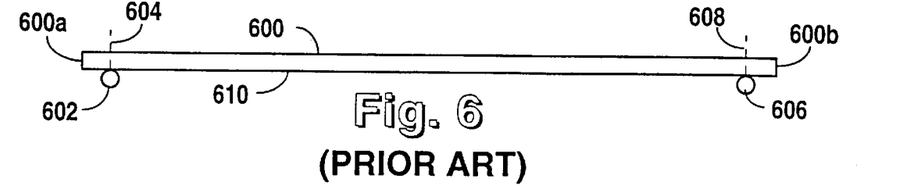
FIG. 6 is a side view of a support system according to prior art.

FIG. 6 is a side view of a support system for a substrate 600 according to prior art. Two supports 602 and 606 were generally provided for supporting the substrate 600, where the support 602 was placed along a support contact line 604 relatively close to one edge 600a, and the support 606 was placed along a support contact line 608 relatively close to the other edge 600b, of the substrate 600. Such a support method according to prior art allows the substrate 600 to sag due to gravitational forces. Such sag is greatest at or near the center 610 of the substrate 600. As substrates become larger, including sizes of 650 mm by 550 mm, 700 mm by 1000 mm, 850 mm by 1050 mm, etc., and as the substrates get thinner, from 1.1 mm to 0.7 mm, etc., the inherent mechanical strength of the substrates decreases and they become more susceptible to gravitational forces. This causes increased sagging of the substrates 600. Such sagging is undesirable for many reasons. The sag in the substrate 600 induces residual stresses within the glass as well as within the thin layers and/or films of various metals and process materials that form the miniature circuits mounted along the surface and/or on inner layers of the substrate. Such stress increases the likelihood of damage to the thin layers, which are typically in a range of one micron. Such damage often caused the substrate 600 to fail. Further, increased likelihood of damage decreases overall production yields of the substrates 600.

Figure 7A:
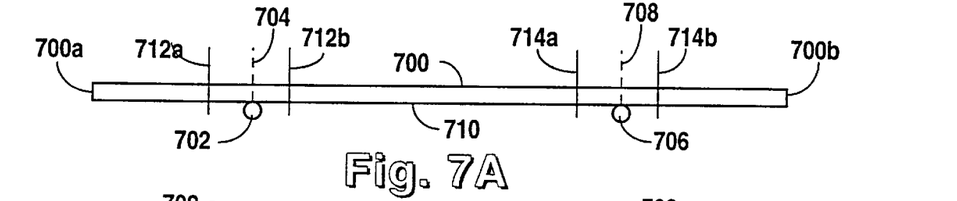
FIGS. 7A and 7B illustrate a support system according to the present invention.
Figure 7B:
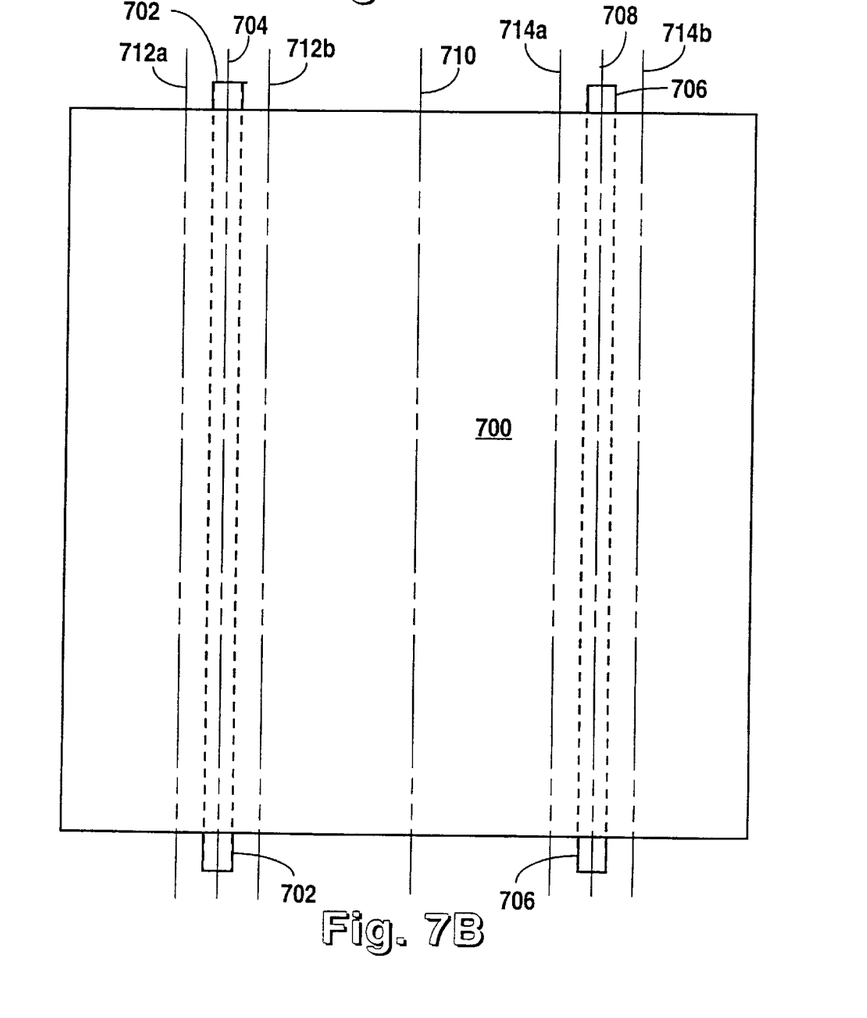

FIGS. 7A and 7B illustrate a support system according to the present invention for supporting a substrate 700. FIG. 7A is a side view showing two supports 702 and 706, which are provided for supporting the substrate 700. The support 702 is placed along a support contact line 704 parallel to and at an offset from the edge 700a relative to a centerline 710 of the substrate 700. Likewise, the support 706 is placed along another support contact line 708 parallel to and at an offset from the edge 700b relative to the centerline 710. Preferably, the offset between the centerline 710 and the support lines 704 and 708 are equal. The particular offset is determined by using a finite element analysis to define the discrete points or lines on the substrate 700 to reduce sag. The support lines 704 and 708 represent the optimal support contact lines for the substrate 700. However, it has been determined that for any particular substrate, a range is defined within which the amount of sag is reduced to an acceptable level along the entire surface of the substrate. For example, two offset lilies 712a and 712b on either side of the support line 704, and two offset lines 714a and 714b on either side of the support line 708, represent an acceptable range for each of the supports 702 and 706. FIG. 7B is a top view illustrating that the supports 702 and 706 may extend along the full length of the substrate 700.

A pair of supports 702 and 706 could be used within the substrate carrier 100 instead of a group of four substrate supports 132. In this manner, a single support rod or beam replaces each pair of support rods 128 and extends along the length of the substrate 124. The supports 702, 706 are made of a similar material as the support rods 128, such as a plastic material with sufficient chemical, abrasion and mechanical properties for interfacing the substrates 124. The supports 702, 706 are preferably made of a thermoplastic, such as PEEK or the like. Two support arms, such as two of the support arms 126, are mounted on either end of each of the supports 702 and 706 for maintaining the supports 702 and 706 in the desired support position for the substrate 124. In this manner, only four such support arms are used rather than eight for each substrate.

The substrate 124 shown in FIGS. 1–5 is preferably a 550 mm by 650 mm substrate having a thickness of approximately 0.7 mm. It has been determined that the substrate 124 may be supported along supports lines separated by approximately 315 mm from each other and centered relative to a centerline parallel with the 650 mm side edges. These optimal support lines support the substrate 124 with less than 1 mm sag along the entire surface of the substrate 124. Further experimentation has revealed, however, that each support line is centered in an acceptable support region that is 25 mm wide, or 12.5 mm to either side of the optimal support line. Thus, a parallel support positioned anywhere within this region results in the sag being reduced to less than 1 mm along the entire surface of the substrate 124. For the substrate 700 shown in FIG. 7B, this region is defined between the lines 712a and 712b and between the lines 714a and 714b.

Experimentation has also revealed that the parallel support lines of contact need not extend along the entire length of the substrate. In fact, the support lines may be broken into discrete segments for a total of 35% to 50% of the full support line. For example, each of the support lines of the substrate 124 are 650 mm in length. Each of the support rods 128 are approximately 150 mm in length for a total of approximately 300 mm per support line of contact, which is approximately 45% of each full support line of contact.

A substrate support system according to the present invention provides many benefits for the support and processing of substrates, especially for glass FPDs. By minimizing the sag of the substrates, the stresses within the glass and applied to the films are substantially reduced, which increases the yield and performance of the substrates. The substrate is held in a smaller and more precise and predictable plane that assists automated processing equipment, such as robotic pick and place units. Automated processing systems can operate at a smaller and tighter tolerance substrate plane and thus need not accommodate a larger substrate plane. Automated processing systems can further reduce the lifting displacement to remove a substrate from a carrier. In prior art, for example, a robotic system had to displace the substrate a further distance to lift the substrate from its sagging position. Such increased displacement added to the automation cost since robots having increased travel capability were required. Furthermore, since the substrate does not sag using a support system according to the present invention, the edges of each substrate are significantly more perpendicular to the bottom and top surfaces of the substrate, thereby better defining the location of the edges for alignment.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A substrate support apparatus for supporting at least one substrate in a substrate carrier, comprising:

a first support for mounting to the substrate carrier and positioned to support a substrate at a plurality of points along a first support line on a surface and substantially offset from a peripheral edge of the substrate; and a second support for mounting to the substrate carrier and positioned to support the substrate at a plurality of points along a second support line on the surface and substantially offset from the peripheral edge of the substrate, wherein the first and second supports support the substrate with reduced sag.

2. The substrate support apparatus of claim 1, wherein the first and second support lines are determined by finite element analysis of the substrate.

3. The substrate support apparatus of claim 1, wherein the first and second support lines support opposite sides of the substrate.

4. The substrate support apparatus of claim 1, wherein the first and second support lines are parallel to and offset from a centerline of the substrate.

5. A substrate support apparatus for supporting at least one substrate in a substrate carrier, comprising:

a plurality of first supports for mounting to the substrate carrier and positioned to support a substrate at a corresponding plurality of points along a first support line on a surface and offset from a peripheral edge of the substrate; and a plurality of second supports for mounting to the substrate carrier and positioned to support the substrate at a corresponding plurality of points along a second support line on the surface and offset from the peripheral edge of the substrate, wherein the first and second supports support the substrate with reduced sag.

6. The substrate support apparatus of claim 5, wherein the first and second support lines are determined by finite element analysis of the substrate.

7. The substrate support apparatus of claim 5, wherein the first and second support lines support opposite sides of the substrate.

8. The substrate support apparatus of claim 5, wherein the first and second support lines are parallel to and offset from a centerline of the substrate.

9. A substrate carrier for supporting a plurality of substrates in a spaced relationship relative to each other, comprising:

a housing; and a plurality of supports mounted to the housing and positioned to support each substrate at a plurality of points along first and second support lines on a surface and substantially offset from a peripheral edge of each substrate to support the substrate with reduced sag.

10. The substrate support apparatus of claim 9, wherein the first and second support lines are determined by finite element analysis of a substrate.

11. The substrate support apparatus of claim 9, wherein the first and second support lines are positioned at respective sides of each substrate.

12. The substrate support apparatus of claim 11, wherein the first and second support lines are parallel to and offset from a centerline of each substrate.

* * * * *